United States Patent
Kotani (10) Patent No.: US 6,855,633 B2
(45) Date of Patent: Feb. 15, 2005

(54) METHOD FOR FABRICATING SEMICONDUCTOR DEVICE

(75) Inventor: Naoki Kotani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 259 days.

(21) Appl. No.: 10/225,127

(22) Filed: Aug. 22, 2002

(65) Prior Publication Data

US 2003/0040187 A1 Feb. 27, 2003

(30) Foreign Application Priority Data

Aug. 27, 2001 (JP) ........................................ 2001-256562

(51) Int. Cl.[7] ............................................. H01L 21/302
(52) U.S. Cl. ........................ 438/691; 438/431; 438/692; 438/706
(58) Field of Search ................................. 438/364, 366, 438/431, 433, 691, 692, 706, 710, 712, 720

(56) References Cited

U.S. PATENT DOCUMENTS 5,246,537 A * 9/1993 Cooper et al. .............. 438/431
6,617,192 B1 * 9/2003 Lowrey et al. ............... 438/95

FOREIGN PATENT DOCUMENTS

| JP | 06-037178 | 2/1994 |
| JP | 11-067891 | 3/1999 |

\* cited by examiner

*Primary Examiner*—Lan Vinh
(74) *Attorney, Agent, or Firm*—McDermott Will & Emery LLP (57) ABSTRACT

A mask (4) for forming active regions is formed on a surface portion of a Si layer (2) serving as a semiconductor region with a thermal oxide film (3) interposed therebetween. Dummy sidewalls (8) are formed over the side surfaces of the mask (4) for forming active regions. Then, etching is performed by using the mask (4) for forming active regions and the dummy sidewalls (8) as a mask to form trenches (9) each defining the side surfaces of the Si layer (2). Thereafter, each of the trenches (9) is filled with a plasma CVD oxide film (11), which is polished till the dummy sidewalls (8) are exposed at the surface. By removing the dummy sidewalls (8), oxidation is performed with the upper-surface edge portions of the Si layer (2) being exposed. This allows the upper-surface edge portions of the Si layer (2) to be oxidized without involving the oxidation of the lower-surface edge portions of the Si layer (2).

4 Claims, 12 Drawing Sheets

METHOD FOR FABRICATING SEMICONDUCTOR DEVICE

BACKGROUND OF THE INVENTION

The present invention relates to a method for fabricating a semiconductor device.

In recent years, rapid miniaturization in the field of semiconductor devices has spurred the trends toward higher-speed operation and lower power consumption. However, conventional processes using bulk silicon wafers are approaching their limits in terms of achieving higher-speed operation and lower power consumption. On the other hand, there have been growing expectations for processes using silicon-on-insulator (hereinafter referred to as SOI) wafers as next-generation devices.

In a process using a SOI device, such as a MOS transistor, formed on a SOI wafer, emphasis has been placed on compatibility with a process using bulk silicon.

FIGS. 11A and 11B and FIGS. 12A and 12B are cross-sectional views illustrating the process steps of fabricating a conventional SOI device.

Figure 11A:
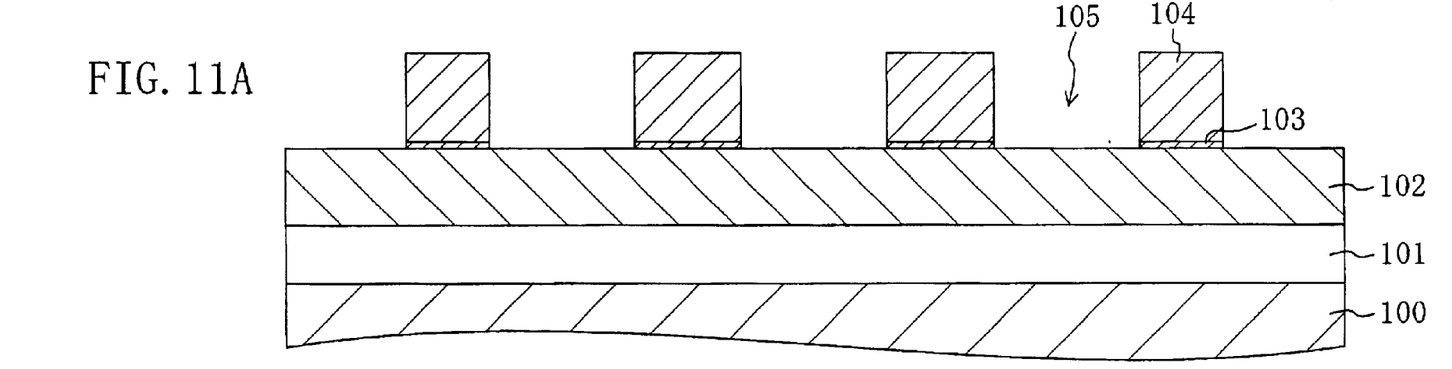
FIGS. 11A and 11B are cross-sectional views illustrating a conventional method for fabricating a semiconductor layer.

First, in the step shown in FIG. 11A, a buried oxide film layer (BOX layer) 101 is formed by a method of implanting oxygen ions into a region at a given depth from a surface of a Si substrate 100 or the like. Then, a Si layer 102 is formed on the BOX layer 101. After an oxide film 103 and a silicon nitride film 104 are grown on the Si layer 102, the oxide film 103 and the silicon nitride film 104 are patterned by lithography and dry etching so that openings are formed in isolation regions 105.

Figure 11B:
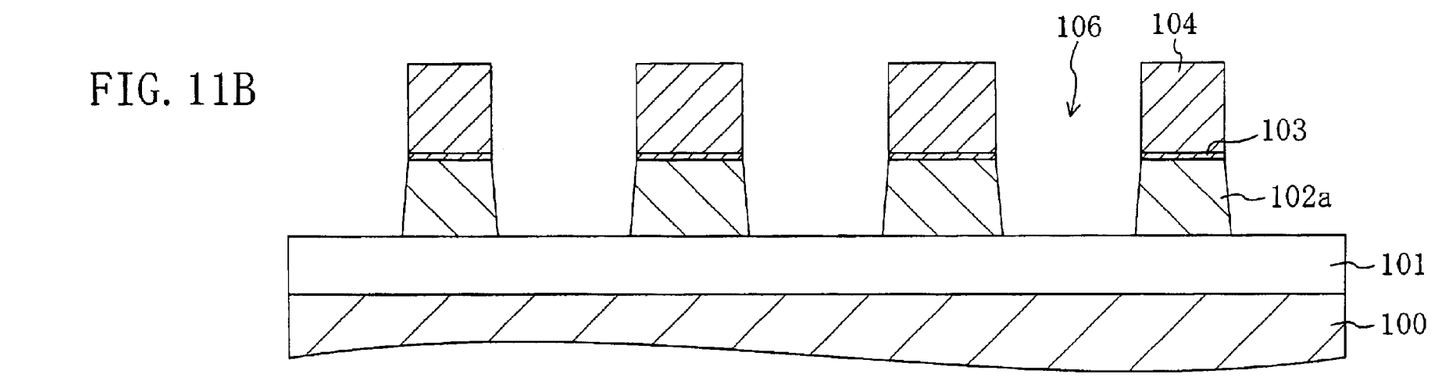

Next, in the step shown in FIG. 11B, the Si layer 102 is patterned by dry etching by using the silicon nitride film 104 as a mask so that transistor regions 102a each composed of the Si layer are formed, while trenches 106 are formed simultaneously in the isolation regions 105.

Figure 12A:
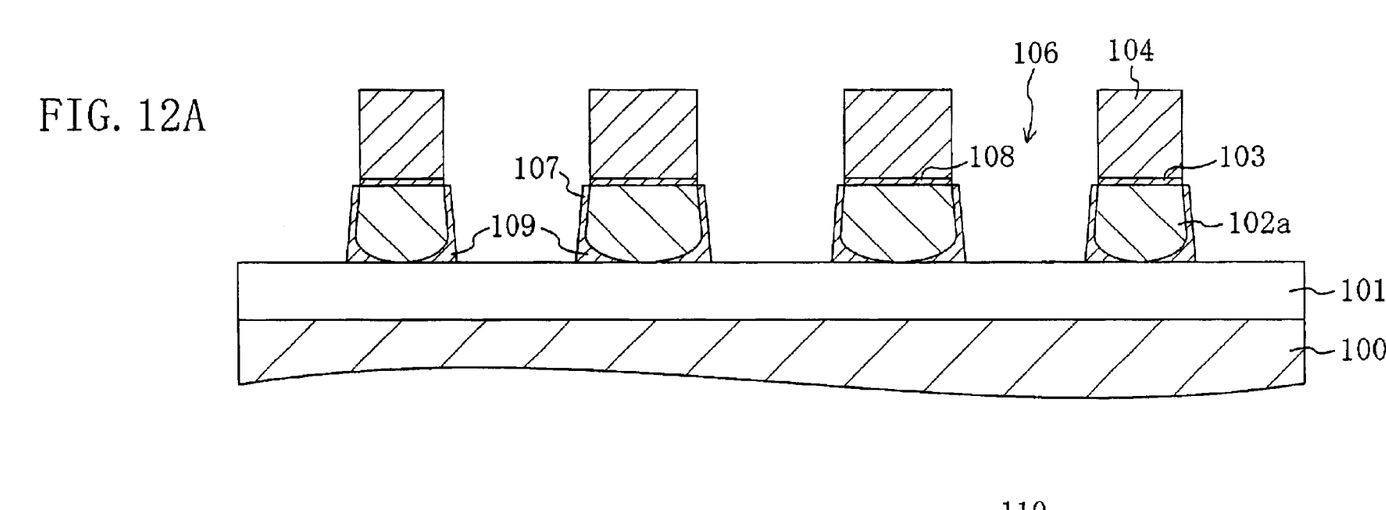
FIGS. 12A and 12B are cross-sectional views illustrating the conventional method for fabricating a semiconductor layer.

Next, in the step shown in FIG. 12A, the side surfaces of the transistor region 102a are oxidized so that sidewall oxide films 107 are formed. At the same time as the formation of the sidewall oxide films 107, the edge portions of the upper surfaces of the transistor regions 102a are rounded off so that the localization of an electric field to the edge portions is suppressed.

Figure 12B:
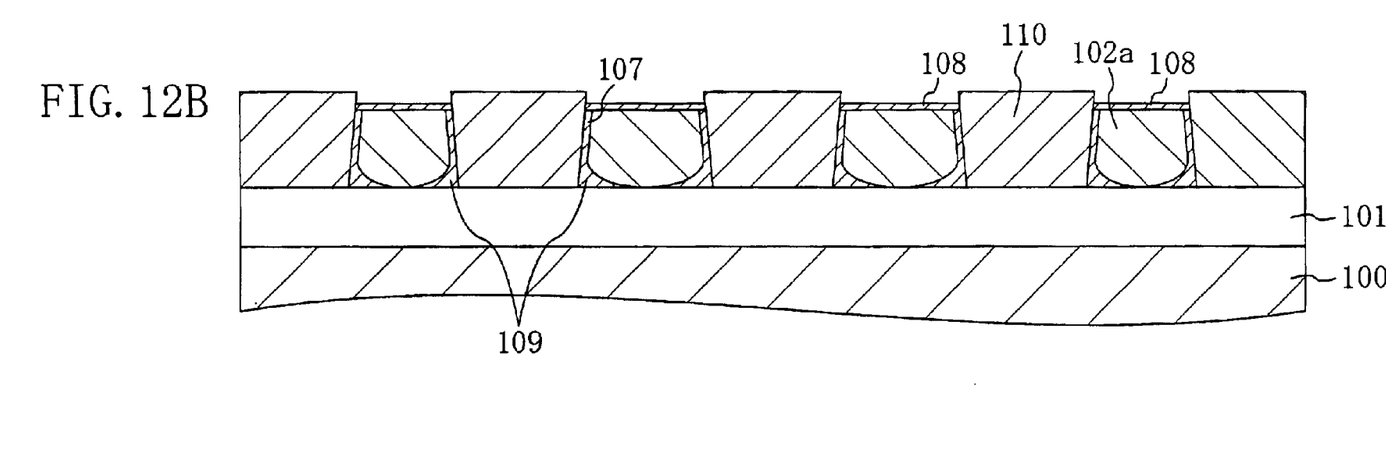

Then, in the step shown in FIG. 12B, CVD oxide films are buried in the trenches 106 to form buried shallow trench isolations 110 (hereinafter referred to as STIs).

However, the conventional SOI device has the following problems.

When the sidewall oxide films 107 are formed in the step shown in FIG. 12A, the lower-surface edge portions of the transistor regions 102a in contact with the BOX layer 101 are significantly oxidized. At this time, the transistor regions 102a are oxidized not only by oxygen passing through the sidewall oxide films 107 but also by oxygen passing through the BOX layer 101, so that abnormal oxide regions 109 are formed. This warps the lower-surface edge regions of the transistor regions 102a upward and deforms the substrate. Consequently, a failure occurs in the portion of the transistor regions 102a on which the stress of deformation is exerted and malfunction or a leakage current resulting from the failure may occur.

However, if an amount of oxidation is reduced for the suppression of abnormal oxidation of the lower-surface edge regions of the transistor regions 102a as described above, the upper-surface edge portions of the transistor regions 102a cannot be rounded off satisfactorily. This causes the localization of an electric field to the upper-surface edge portions. In the subsequent step, the problem of a reduction in threshold voltage may occur due to partial destruction of a gate oxide film.

SUMMARY OF THE INVENTION

It is therefore an object of the present invention to provide a SOI device wherein the localization of an electric field is suppressed by oxidizing the upper-surface edge portions of a transistor region of a SOI substrate, while suppressing the oxidation of the lower-surface edge portions of the transistor region and thereby preventing the occurrence of a failure, and a method for fabricating the same.

A method for fabricating a semiconductor device according to the present invention is a method for fabricating a semiconductor device using a substrate having a substrate insulator layer and a semiconductor layer provided on the substrate insulator layer and formed with an active layer of a semiconductor element, the method comprising the steps of: (a) forming a mask for forming active region on a surface portion of the semiconductor layer; (b) forming a dummy side wall over side surfaces of the mask for forming active region; (c) performing etching by using the mask for forming active region and the dummy sidewall as a mask to remove a portion of the semiconductor layer and thereby form a trench defining side surfaces of the semiconductor layer; (d) after the step (c), filling the trench with an insulating film for isolation; (e) removing the dummy sidewall to expose an upper-surface edge portion of the semiconductor layer; and (f) after the step (e), oxidizing the upper-surface edge portion of the semiconductor layer.

In the arrangement, the upper-surface edge portion of the semiconductor layer is exposed in the step (f) of oxidizing the upper-surface edge portion of the semiconductor layer, while the lower-surface edge portion of the semiconductor layer is covered with the insulating film for isolation. As a consequence, the upper-surface edge portion of the semiconductor layer can be rounded off satisfactorily by oxidation, while the lower-surface edge portion of the semiconductor layer is not deformed by oxidation. This prevents the occurrence of a failure resulting from deformation of the lower-surface edge portion of the semiconductor layer and eliminates the possibility of malfunction or leakage current resulting from the failure.

The step (d) includes depositing the insulating film for isolation on the substrate, polishing the insulating film for isolation by CMP till a surface of the mask for forming active region is exposed, and thereby filling the trench with the insulating film for isolation, the method further comprising the step of: after the step (f), selectively removing the mask for forming active region. The arrangement allows only the edge portion of the upper surface of the semiconductor layer to be exposed in the step (e) and allows the edge portion of the semiconductor layer to be rounded off more positively by oxidation in the step (f).

Preferably, the method further comprises the step of: after the step (c) and prior to the step (d), forming a sidewall oxide film with a thickness of 5 nm or less over the side surfaces of the semiconductor layer exposed in the trench, wherein the step (f) includes forming an oxide film with a thickness of 25 nm or more by oxidation.

DETAILED DESCRIPTION OF THE INVENTION

Embodiment

Referring to FIGS. 1A and 1B to FIG. 10, a semiconductor device according to an embodiment of the present invention and a method for fabricating the same will be described.

FIGS. 1A and 1B to FIG. 10 are cross-sectional views illustrating the process steps of fabricating a SOI device according to the embodiment.

Figure 1A:
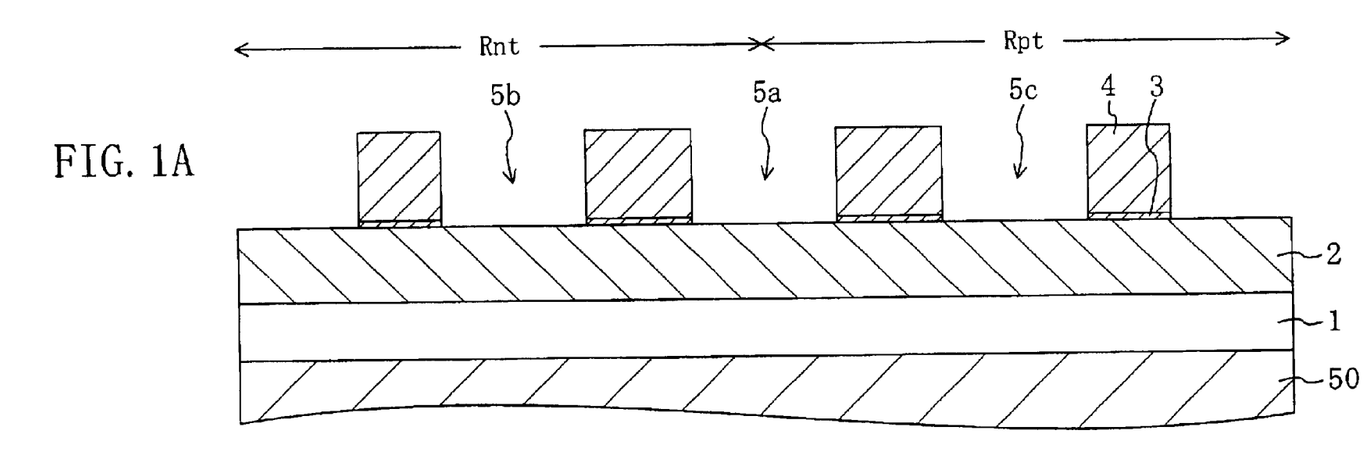
FIGS. 1A and 1B are cross-sectional views illustrating the steps of forming trench isolation regions and the like in a fabrication process according to an embodiment of the present invention.

First, in the step shown in FIG. 1A, a BOX layer 1 with a thickness of 150 nm is formed in accordance with a method of implanting oxygen ions in a region at a given depth from a surface of a Si substrate 50 or the like and a Si layer 2 with a thickness of 180 nm is left on the BOX layer 1. Then, a thermal oxide film with a thickness of 10 nm is formed on the Si layer 2 and a silicon nitride film with a thickness of 180 nm is formed by CVD on the thermal oxide film. Each of the Si substrate 50, the BOX layer 1, and the Si layer 2 is partitioned into an NMIS formation region Rnt for forming N-channel transistors and a PMIS formation region Rpt for forming P-channel transistors. Thereafter, the thermal oxide film and the silicon nitride film are patterned by lithography and dry etching to form thermal oxide films 3 and a mask 4 for forming active regions, while the portions of the Si layer 2 located in the isolation region have surfaces temporarily exposed. The isolation regions can be subdivided into: an NMIS-PMIS isolation region 5a for providing isolation between the N-channel and P-channel transistors from each other; an NMIS isolation region 5b for providing isolation between the N-channel transistors; and a PMIS isolation region 5c for providing isolation between the P-channel transistors. A material composing the Si layer 2 is not limited to single-crystal Si. Another semiconductor material such as SiGe or SiGeC may also be used instead. A material composing the mask 4 for forming active regions is not limited to a silicon nitride. Another material that can be etched selectively from the material composing the Si layer 2 may also be used instead.

Figure 1B:
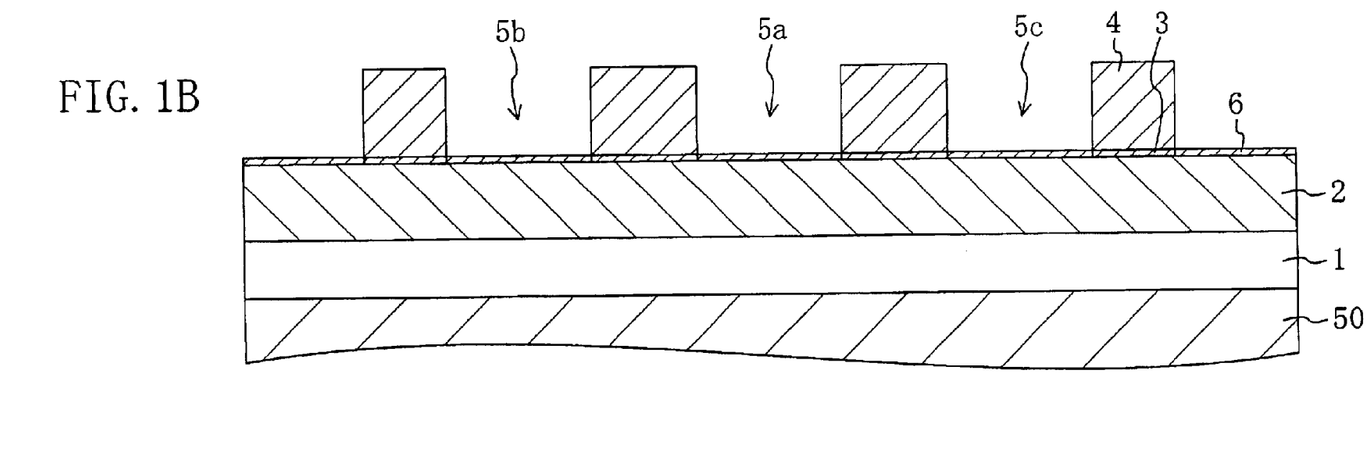

Next, in the step shown in FIG. 1B, the upper surface of the Si layer 2 exposed in the NMIS-PMIS isolation region 5a, in the NMIS isolation region 5b, and in the PMIS isolation region 5c is oxidized to form a thermal oxide film 6. Consequently, the thermal oxide films 3 and 6 are joined to each other so that the upper surface of the Si layer 2 is covered entirely with the oxide film.

Figure 2A:
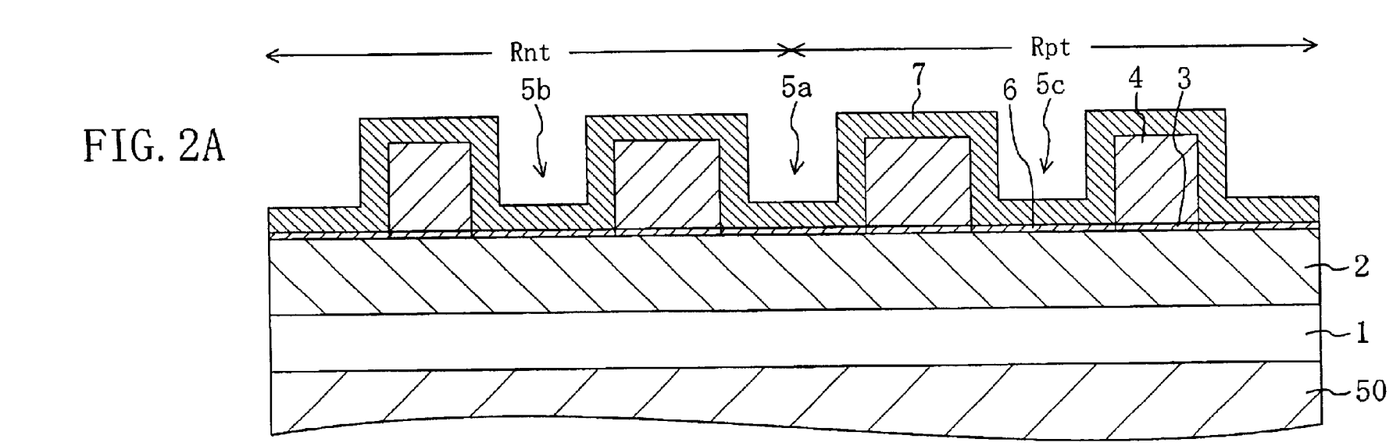
FIGS. 2A and 2B are cross-sectional views illustrating the steps till dummy sidewalls are formed in the fabrication process according to the embodiment.

In the step shown in FIG. 2A, an amorphous silicon film 7 with a thickness of 30 nm is formed.

Figure 2B:
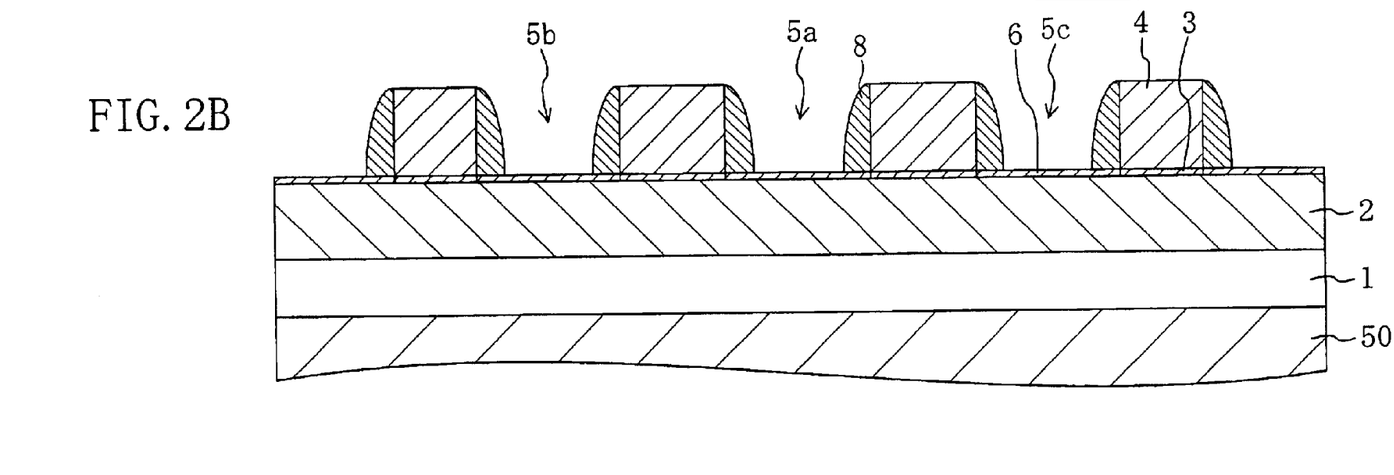

Next, in the step shown in FIG. 2B, the amorphous silicon film 7 is etched by anisotropic dry etching to form dummy sidewalls 8 each composed of amorphous silicon on the side surfaces of the mask 4 for forming active regions.

Figure 3A:
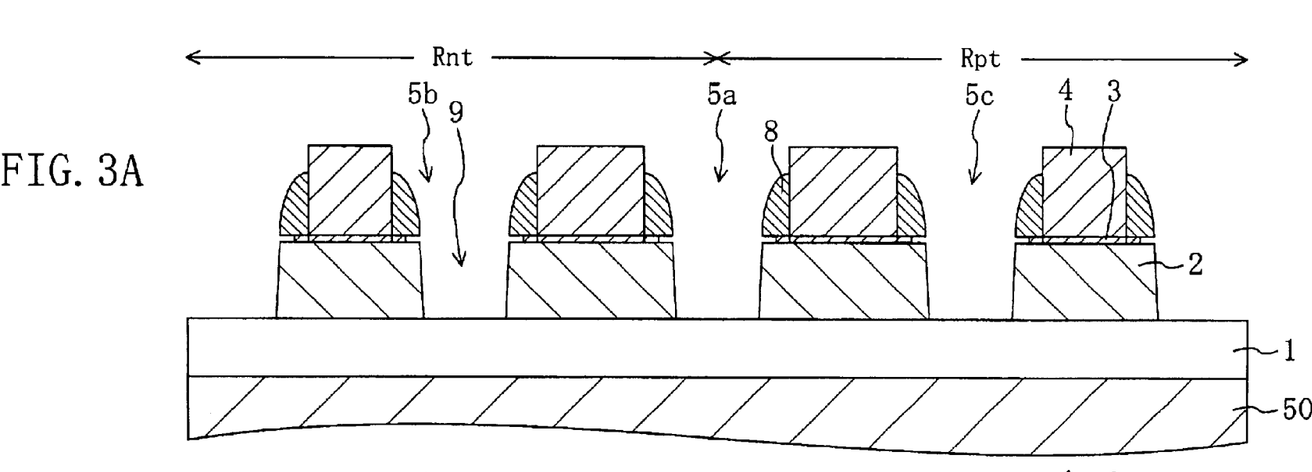
FIGS. 3A and 3B are cross-sectional views illustrating the steps of forming trenches and the like in the fabrication process according to the embodiment.

Next, in the step shown in FIG. 3A, the exposed portions of the thermal oxide film 6 and the underlying portions of the Si layer 2 are removed by dry etching using the mask 4 for forming active regions and the dummy sidewalls 8 as a mask, whereby trenches 9 defining the side surfaces of the Si layer 2 and reaching the BOX layers 1 are formed in the NMIS-PMIS isolation region 5a, in the NMIS isolation region 5b, and in the PMIS isolation region 5c. At that time, the dummy sidewalls 8 are not completely removed and are left, though they are retracted. This may be because the dummy sidewalls 8 composed of amorphous silicon has an etching selectivity different from that of the Si layer 2. At the same time, a portion of the thermal oxide film 3 is also removed.

Figure 3B:
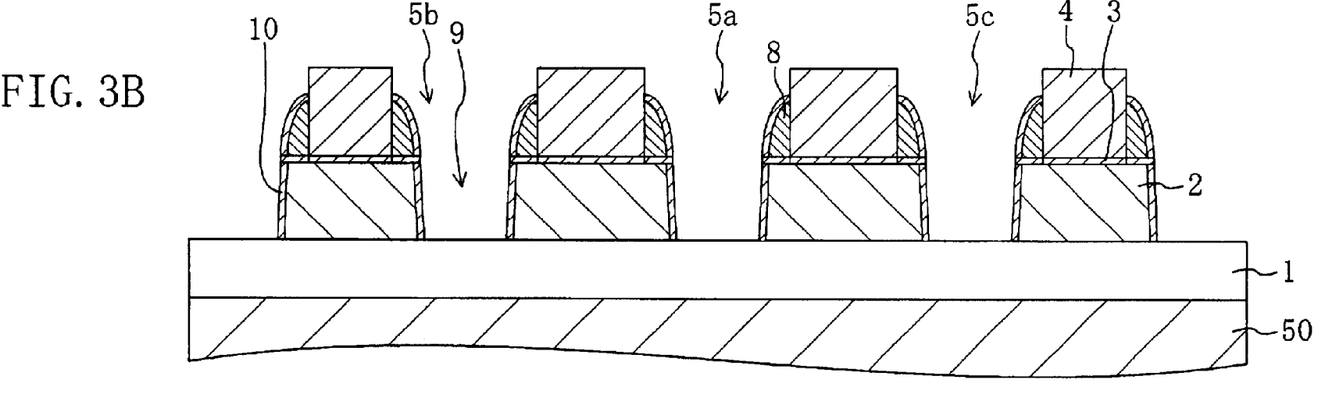

Next, in the step shown in FIG. 3B, the surface of the substrate is oxidized such that sidewall oxide films 10 with a thickness of about 5 nm is formed on the side surfaces of the Si layer 2 exposed in the trenches 9. At the same time, an oxide film is formed also on each of the exposed surface portions of the dummy sidewalls 8.

In accordance with the conventional fabrication method, it is necessary to round off the upper-surface edge portions of the Si layer by oxidation at the same time as the sidewall oxide films are formed on the side surfaces of the Si layer. To round off the upper-surface edge portions of the Si layer, however, oxidation should be performed such that the thickness of each of the sidewall oxide films is 25 nm or more. Consequently, the oxidation of the lower-surface edge portions of the Si layer is likely to proceed and the Si layer may warp to be deformed.

According to the present embodiment, by contrast, the upper-surface edge portions of the Si layer 2 need not be rounded off when oxidation is performed to form the sidewall oxide films 10 in the step shown in FIG. 3B. Therefore, it is no more necessary to form the oxide films thick and the thickness of each of the sidewall oxide films 10 can be reduced to 5 nm or less so that the lower end portion of the Si layer 2 is more resistant to oxidation. This suppresses the occurrence of a failure resulting from significant deformation of the Si layer 2 and thereby circumvents the occurrence of a leakage current resulting from the failure.

Figure 4A:
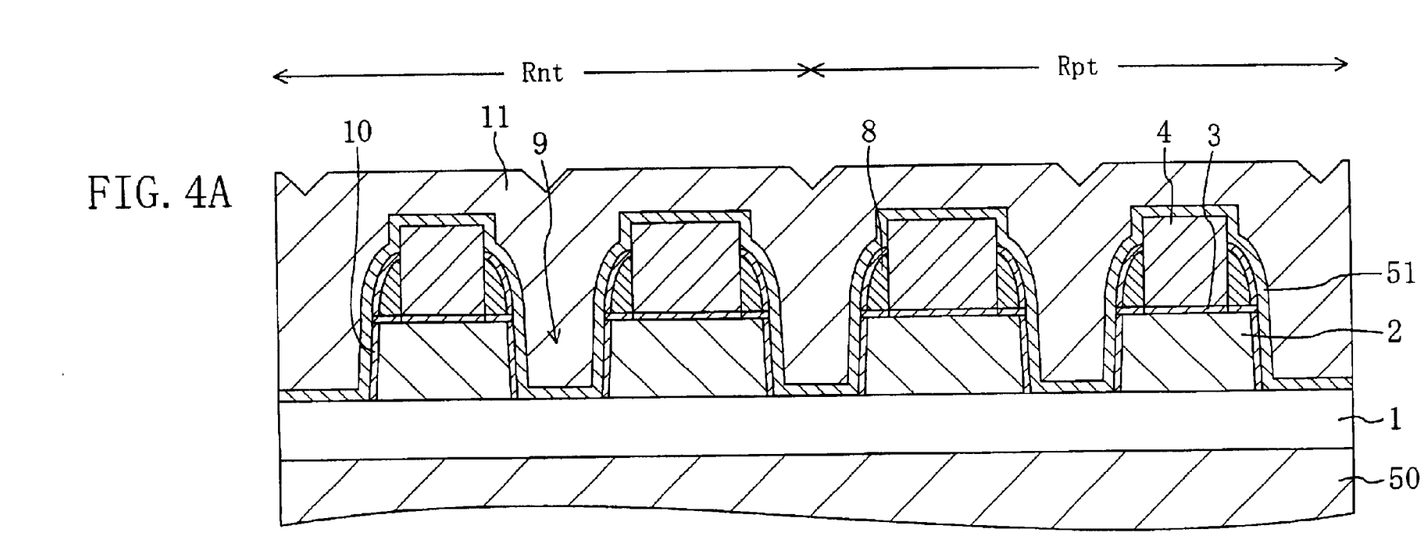
FIGS. 4A and 4B are cross-sectional views illustrating the steps of depositing and polishing a plasma CVD oxide film in the fabrication process according to the embodiment.

Next, in the step shown in FIG. 4A, a TEOS film 51 (CVD oxide film) with a thickness of 20 nm is deposited on the substrate. Then, an oxide film with a thickness of 450 nm is deposited by plasma CVD so that a plasma CVD oxide film 11 to be buried in the trenches 9 is formed.

Figure 4B:
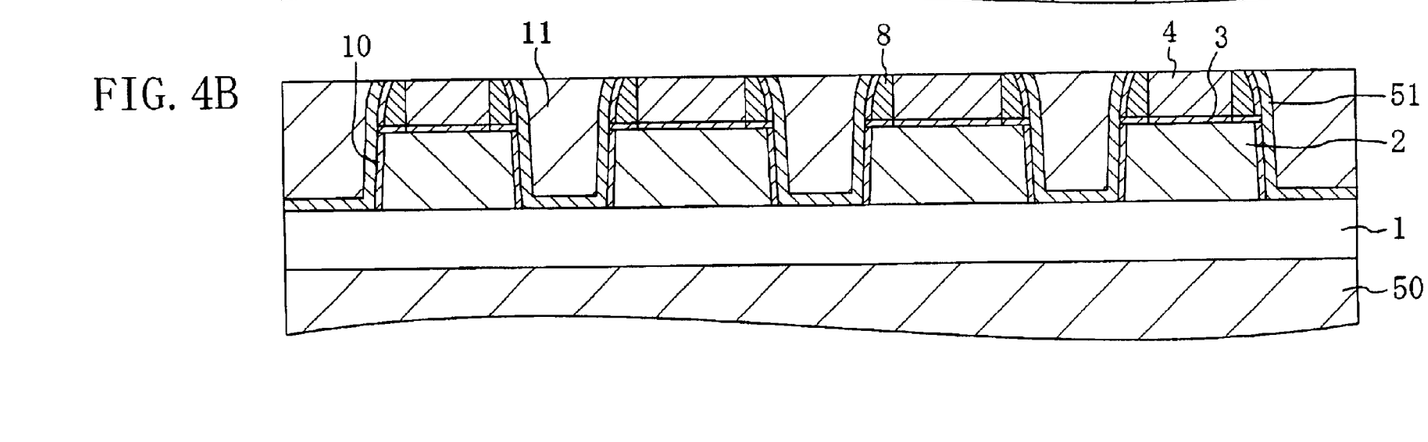

Next, in the step shown in FIG. 4B, the TEOS film 51 on the substrate and the plasma CVD oxide film 11 are polished by CMP till the mask 4 for forming active regions, the dummy sidewalls 8, and the TEOS film 51 are exposed at the surface.

Figure 5A:
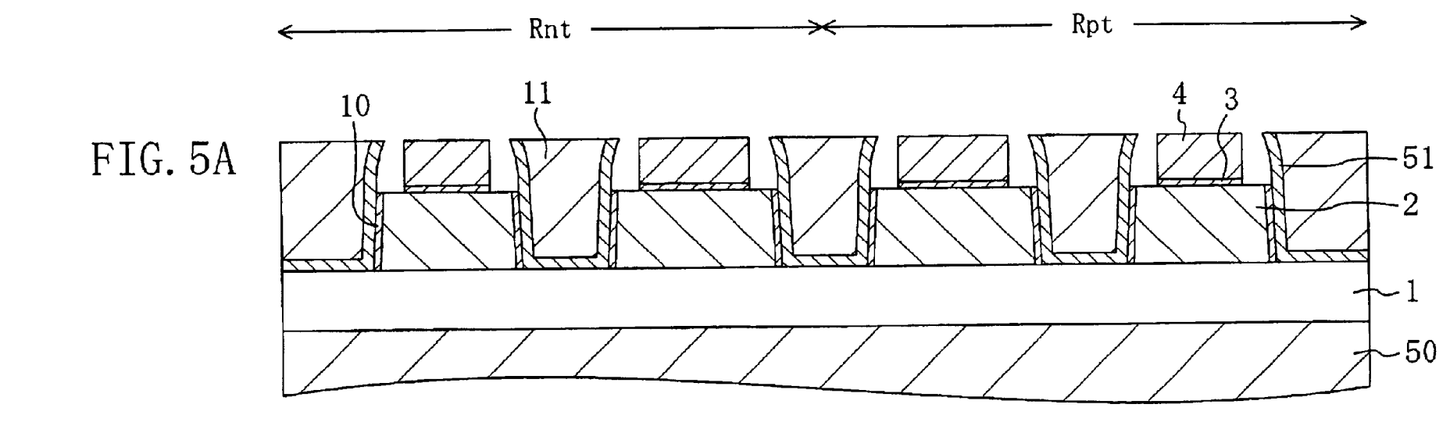
FIGS. 5A and 5B are cross-sectional views illustrating the steps of rounding off the upper-surface edge portions of the Si layer and the like in the fabrication process according to the embodiment.

Next, in the step shown in FIG. 5A, the dummy sidewalls 8 having their upper surfaces exposed at the substrate and the portions of the thermal oxide layer 3 underlying the dummy sidewalls 8 are removed by wet etching, whereby the edge portions of the upper surface of the Si layer 2 are exposed.

Figure 5B:
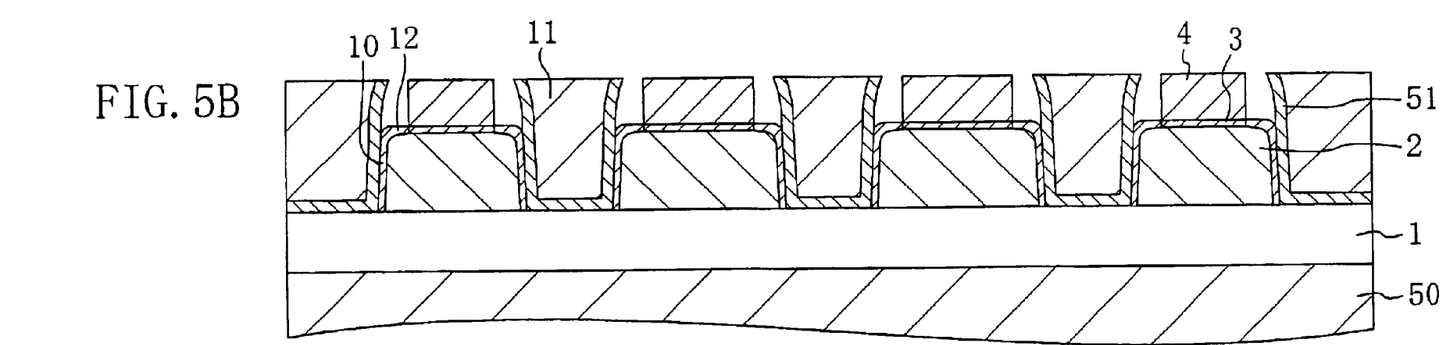

Next, in the step shown in FIG. 5B, the exposed portions of the Si layer 2 are oxidized so that oxide films 12 with a thickness of 25 nm are formed on the exposed surface portions of the Si layer 2. At this stage, the upper-surface edge portions of the Si layer 2 are in a state prone to oxidation since they are exposed. By supplying oxygen to the upper-surface edge portions of the Si layer 2, therefore, the edge portions can be rounded off satisfactorily by oxidation. That is, the oxide films 12 are formed in such a manner as to cover the Si layer 2 having the upper-surface edge portions thereof rounded off.

In the step of oxidizing the upper-surface edge portions of the Si layer in accordance with the conventional fabrication method, the lower-surface edge portions of the Si layer are exposed so that they are in a state prone to oxidation. If an oxide film with a thickness of 25 nm is formed to round off the upper-surface edge portions of the Si layer, therefore, the lower-surface edge portions of the Si layer are also oxidized significantly so that the Si layer is deformed.

In the present embodiment, by contrast, the upper-surface edge portions of the Si layer 2 are in a state prone to oxidation. On the other hand, the lower-surface edge portions of the Si layer 2 are in a state resistant to oxidation since they are covered with the TEOS film 51 and the plasma CVD oxide film 11. Even if oxidation is performed to form an oxide film having a given thickness or more such that the upper-surface edge portions of the Si layer 2 are rounded off, the lower-surface edge portions of the Si layer 2 are no more oxidized significantly. As a result, the occurrence of a leakage current resulting from a failure caused by significant deformation can be suppressed.

Figure 6A:
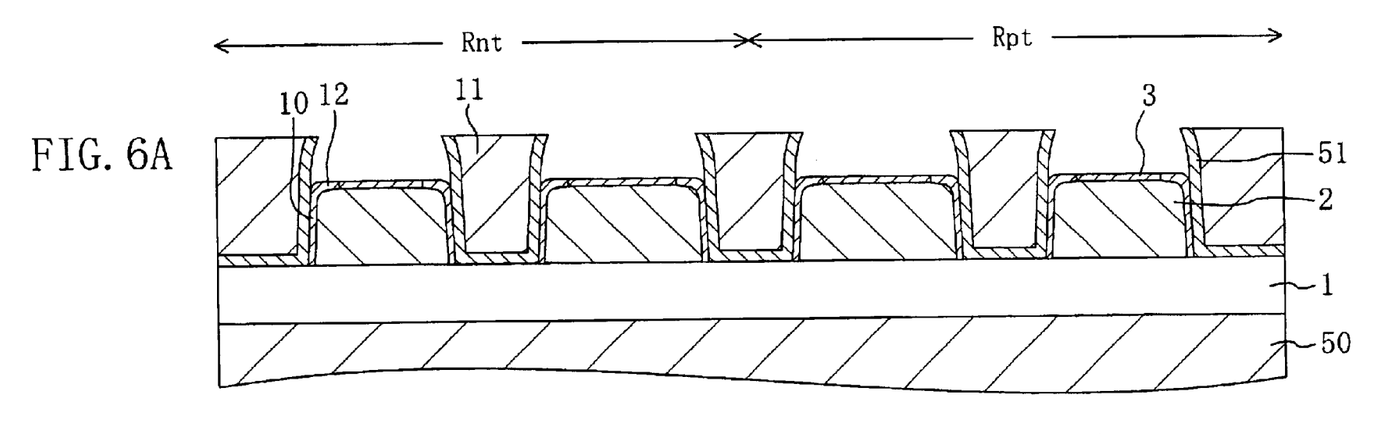
FIGS. 6A and 6B are cross-sectional views illustrating the steps of forming threshold control layers and the like in the fabrication process according to the embodiment.

Next, in the step shown in FIG. 6A, the mask 4 for forming active regions having its upper surface exposed at the substrate is removed by a process using a boiling phosphoric acid.

Figure 6B:
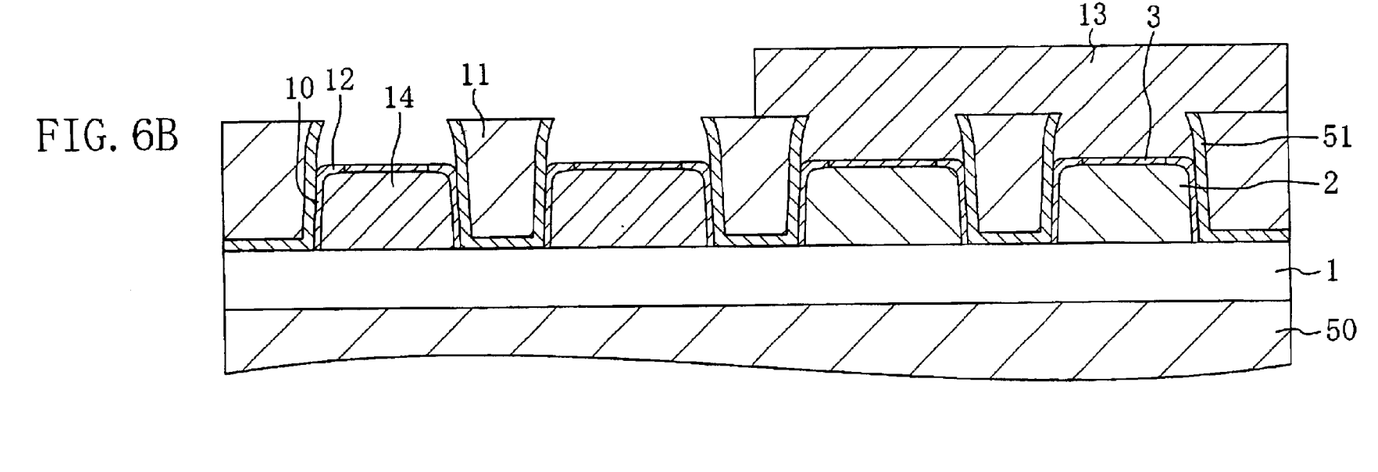

Next, in the step shown in FIG. 6B, a first resist mask 13 having an opening corresponding to the NMIS formation region Rnt is formed by lithography. Then, boron ions, e.g., are implanted in the portion of the Si layer 2 located in the NMIS formation region Rnt at a dose of $5.5 \times 10^{12}$ atoms/cm$^2$ with an acceleration energy of 30 KeV so that NMIS threshold control layers 14 are formed.

Figure 7A:
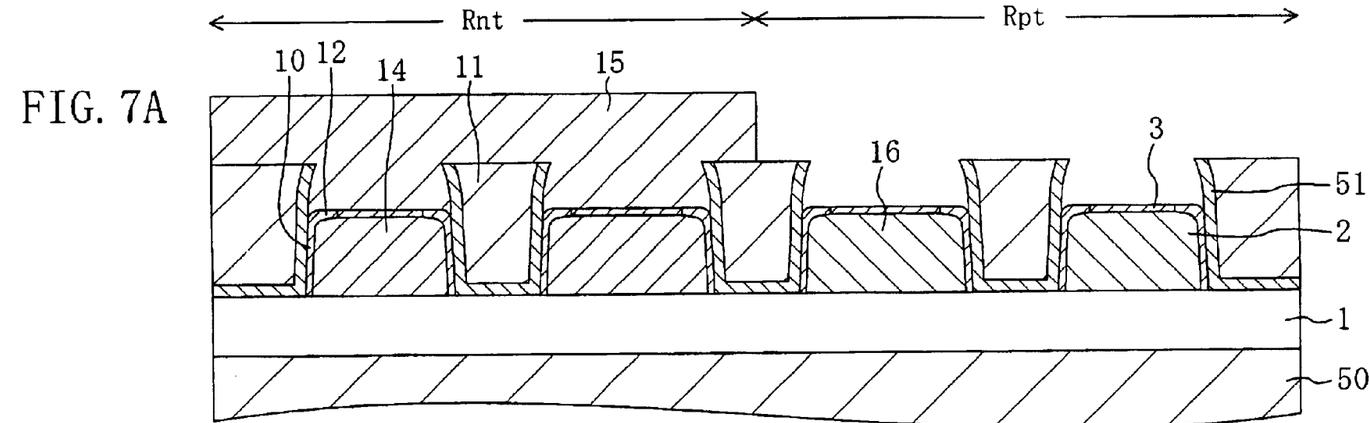
FIGS. 7A and 7B are cross-sectional views illustrating the steps of forming gate electrodes and the like in the fabrication process according to the embodiment.

Next, in the step shown in FIG. 7A, the first resist mask 13 is removed. Then, a second resist mask 15 having an opening corresponding to the PMIS formation region Rpt is formed by lithography. Then, phosphorus ions, e.g., are implanted in the portion of the Si layer 2 located in the PMIS formation region Rpt at a dose of $1.2 \times 10^{12}$ atoms/cm$^2$ with an acceleration energy of 50 KeV so that PMIS threshold control layers 16 are formed. Thereafter, the second resist mask 15 is removed.

Figure 7B:
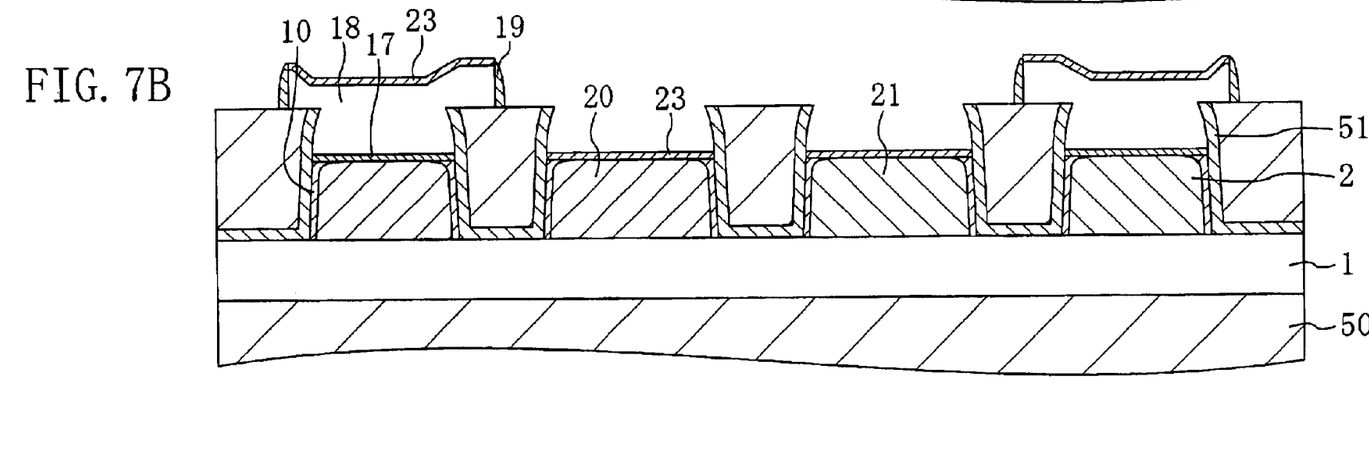

Next, in the step shown in FIG. 7B, the thermal oxide film 6 and a portion of each of the oxide films 12 are removed by wet etching. Then, gate oxide films 17 and gate electrodes 18 are formed by the same method as the conventional fabrication method.

Figure 10:
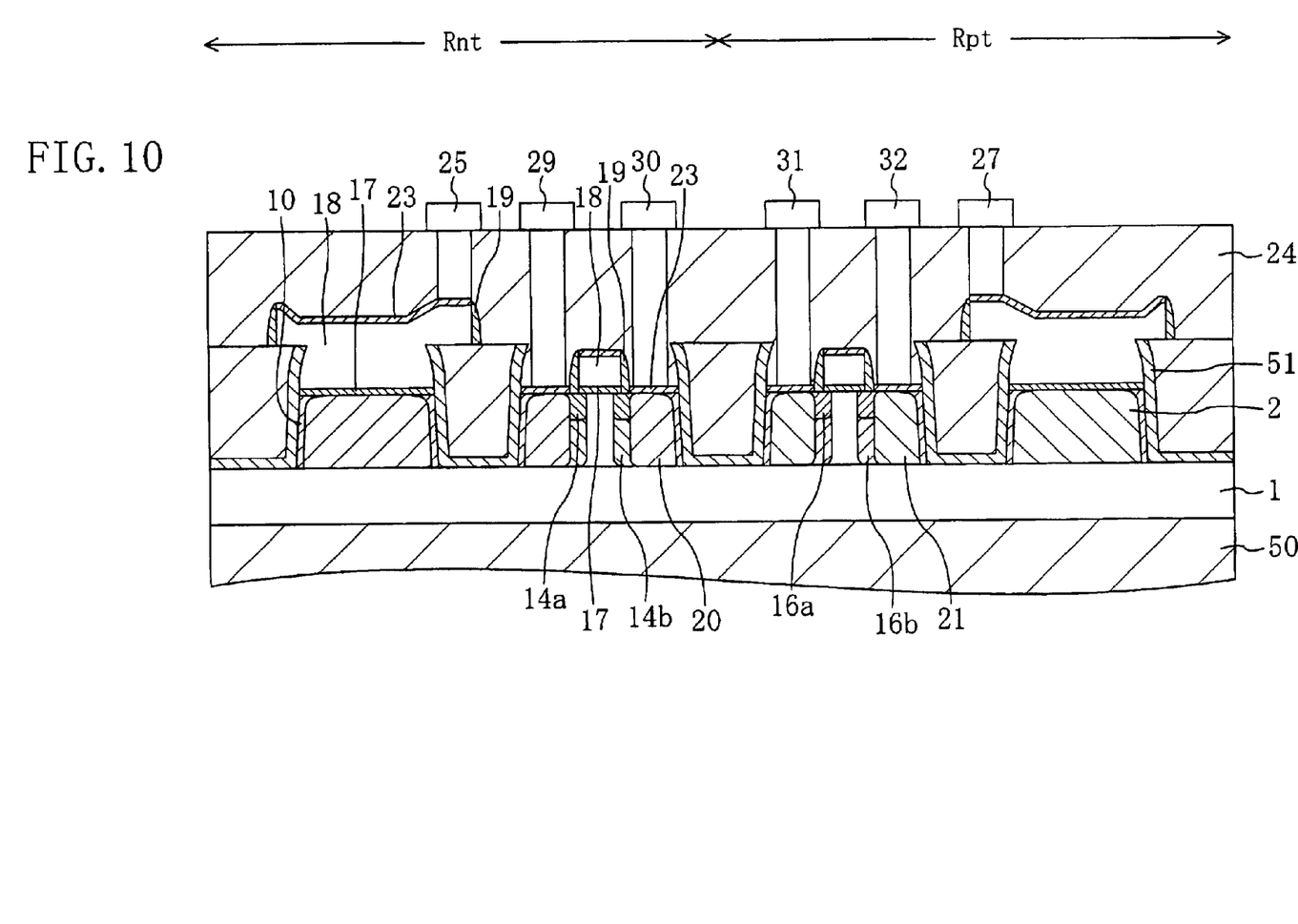
FIG. 10 is a cross-sectional view illustrating the step of forming the wiring in the fabrication process according to the embodiment.

Thereafter, an NMISN lightly doped source/drain diffusion layer 14a, NMISP pocket layers 14b, a PMISP lightly doped source/drain diffusion layer 16a, and PMISN pocket layers 16b are formed by lithography and ion implantation, though they are not depicted in the cross-sectional view of FIG. 7B (see FIG. 10).

Thereafter, LDD sidewalls 19 are formed over the side surfaces of the gate electrodes 18. By using the gate electrodes 18 and the LDD sidewalls 19 as a mask, arsenic ions, e.g., are implanted in the NMIS isolation region Rnt at a dose of $3.0 \times 10^{15}$ atoms/cm$^2$ with an acceleration energy of 50 KeV so that an NMISN heavily doped source/drain diffusion layer 20 is formed, while boron ions, e.g., are implanted in the PMIS isolation region Rpt at a dose of $2.0 \times 10^{15}$ atoms/cm$^2$ with an acceleration energy of 5 KeV so that a PMISP heavily doped source/drain diffusion layer 21 is formed.

Further, a salicide layer 23 is formed over the gate electrodes 18 and the active regions of the Si layer 2.

Figure 8:
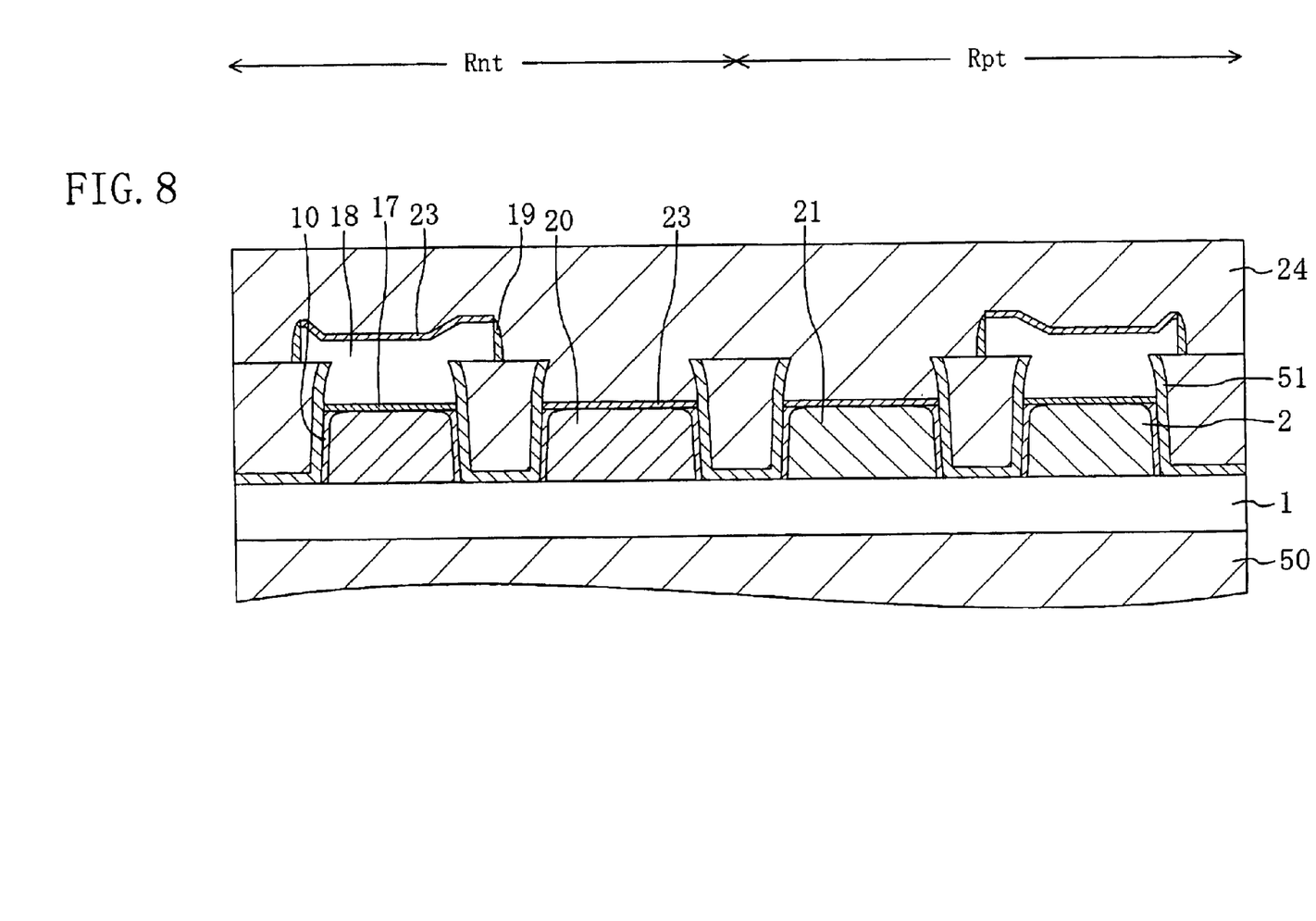
FIG. 8 is a cross-sectional view illustrating the step of forming an interlayer film in the fabrication process according to the embodiment.

Next, in the step shown in FIG. 8, an interlayer film 24 is formed on the substrate.

Figure 9:
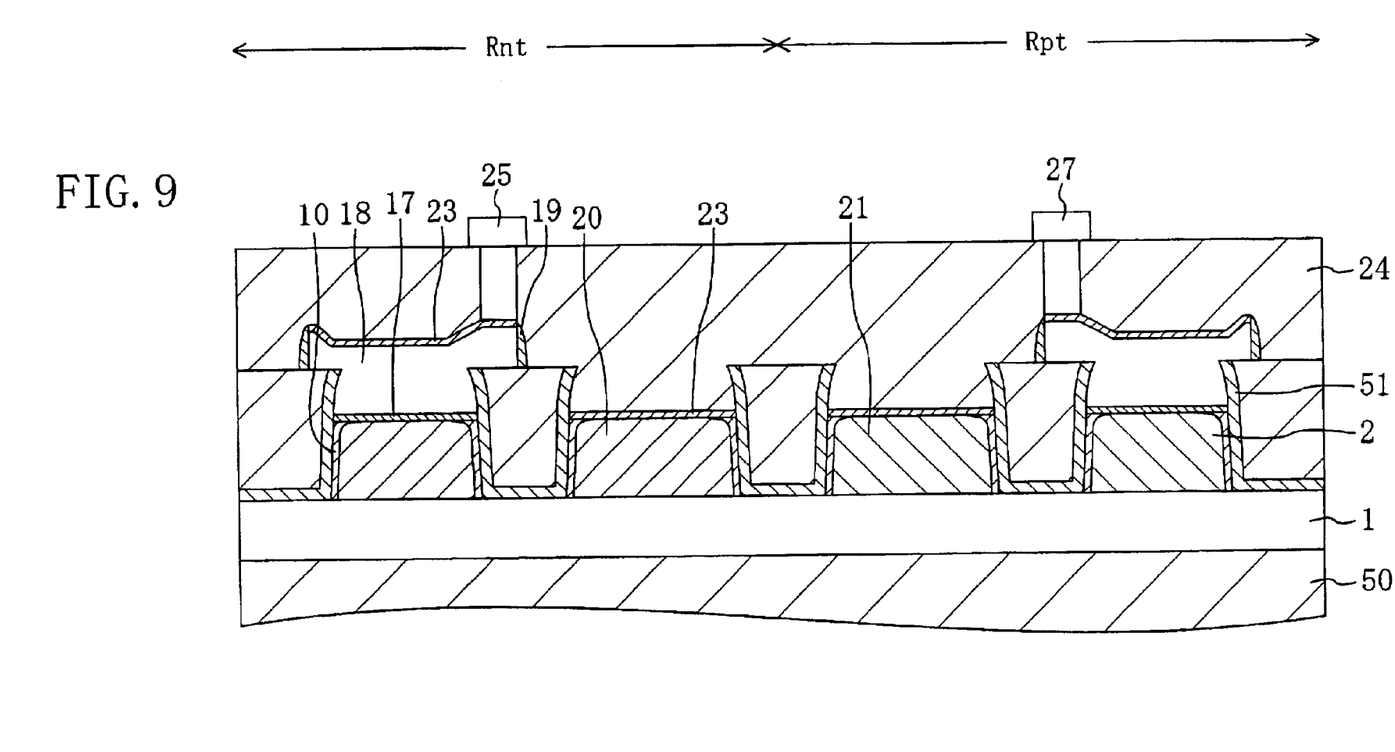
FIG. 9 is a cross-sectional view illustrating the step of forming wiring in the fabrication process according to the embodiment.

Next, in the step shown in FIG. 9, an NMIS gate electrode contact 25 extending through the interlayer film 24 to reach the gate electrode of an N-channel transistor and a PMIS gate electrode contact 27 reaching the gate electrode of a P-channel transistor are formed.

By further forming an NMIS source electrode contact 29 extending through the interlayer film 24 to reach the source region of the NMISN heavily doped source/drain diffusion layer 20, an NMIS drain electrode contact 30 reaching the drain region of the NMISN heavily doped source/drain diffusion layer 20, a PMIS source electrode contact 31 reaching the source region of the PMISP heavily doped source/drain diffusion layer 21, and a PMIS drain electrode contact 32 reaching the drain region of the PMISP heavily doped source/drain diffusion layer 21, a structure as shown in FIG. 10 is obtainable. FIG. 10 is a vertical cross-sectional view showing a structure of one of the transistors of the semiconductor device according to the present embodiment in a cross section parallel to the direction of the gate length, while showing a structure of another of the transistors in a cross section orthogonal to the direction of the gate length. Therefore, FIG. 10 also shows diffusion layers formed in the step shown in FIG. 7B but not shown in FIG. 7B. It is to be noted that the salicide layer 23 is formed between each of the contacts and each of the gate electrodes, the active regions, and the diffusion layers.

When the sidewall oxide films are formed by oxidizing the side surfaces of the Si layer in which the source/drain regions are formed in accordance with the conventional fabrication method, the upper-surface edge portions of the Si layer are also oxidized simultaneously to be rounded off. To round off the upper-edge portions of the Si layer, oxidation should be performed to obtain oxide films each having a given thickness or more. As a consequence, oxidation of the lower-surface edge portions of the Si layer is more likely to proceed and the Si layer may warp to be deformed.

On the other hand, the present embodiment has formed the sidewall oxidation films 10 in the step shown in FIG. 3B and rounded off the upper-surface edge portions of the Si layer 2 in the step shown in FIG. 5B. This obviates the necessity to form oxide films each having an excessively large thickness in the step shown in FIG. 3B so that the lower-surface edge portions of the Si layer 2 are more resistant to oxidation. In contrast to the upper-surface edge portions of the Si layer 2 which are in a state prone to oxidation in the step shown in FIG. 5B, the lower-surface edge portions of the Si layer 2 which are covered with the TEOS film 51 and the plasma CVD oxide film 11 are in a state resistant to oxidation. Even if oxidation is performed to form oxide films each having a given thickness or more such that the upper-surface edge portions of the Si layer 2 are rounded off, the lower-surface edge portions of the Si layer 2 are kept from significant oxidation. This suppresses the occurrence of a leakage current resulting from a failure caused by significant deformation.

What is claimed is:

1. A method for fabricating a semiconductor device using a substrate having a substrate insulator layer and a semiconductor layer provided on the substrate insulator layer and formed with an active layer of a semiconductor element, the method comprising the steps of:

(a) forming a mask for forming an active region on a surface portion of the semiconductor layer;

(b) forming a dummy side wall over side surfaces of the mask for forming the active region;

(c) etching the semiconductor layer by using the mask for forming active region and the dummy sidewall as a mask, thereby forming a trench that reaches the substrate insulator layer;

(d) after the step (c), filling the trench with an insulating film for isolation;

(e) after the step (d), removing the dummy sidewall to expose an upper-surface edge portion of the semiconductor layer; and (f) after the step (e), oxidizing the upper-surface edge portion of the semiconductor layer.

2. The method of claim 1, wherein the step (d) includes depositing the insulating film for isolation on the substrate, polishing the insulating film for isolation by CMP until a surface of the mask for forming the active region is exposed, and thereby filling the trench with the insulating film for isolation, the method further comprising the step of:

after the step (f), selectively removing the mask for forming the active region.

3. The method of claim 1 or 2, further comprising the step of:

after the step (c) and prior to the step (d), forming a sidewall oxide film with a thickness of 5 nm or less over the side surfaces of the semiconductor layer exposed in the trench, wherein the step (f) includes forming an oxide film with a thickness of 25 nm or more by oxidation.

4. The method of claim 1 or 2, wherein the insulating film for isolation is a laminated film composed of a TEOS film and a plasma CVD oxide film.

* * * * *